(12) United States Patent
Wu et al.

(10) Patent No.: US 9,131,598 B2
(45) Date of Patent: Sep. 8, 2015

(54) FIXTURE FOR BREAKING CIRCUIT BOARD

(71) Applicants: Inventec Appliances (Pudong) Corporation, Shanghai (CN); INVENTEC APPLIANCES CORP., New Taipei (TW); INVENTEC APPLIANCES (SHANGHAI) CO., LTD., Shanghai (CN)

(72) Inventors: Xinshen Wu, Shanghai (CN); Xiao-Dong Hu, Shanghai (CN); Jia-yun Shen, Shanghai (CN)

(73) Assignees: INVENTEC APPLIANCES (PUDONG) CORPORATION, Shanghai (CN); INVENTEC APPLIANCES CORP., New Taipei (TW); INVENTEC APPLIANCES (SHANGHAI) CO., LTD., Shanghai (TW)

( * ) Notice: Subject to any disclaimer, the term of this patent is extended or adjusted under 35 U.S.C. 154(b) by 260 days.

(21) Appl. No.: 13/842,487

(22) Filed: Mar. 15, 2013

(65) Prior Publication Data
US 2014/0026408 A1 Jan. 30, 2014

(30) Foreign Application Priority Data
Jul. 27, 2012 (CN) ...................... 2012 2 0386024 U

(51) Int. Cl.
*H05K 3/00* (2006.01)
(52) U.S. Cl.
CPC ................ *H05K 3/00* (2013.01); *H05K 3/0052* (2013.01); *H05K 2203/302* (2013.01); *Y10T 29/53274* (2015.01)

(58) Field of Classification Search
CPC .............. B26D 7/00; B26D 7/01; B26D 7/06; H05K 3/00; H05K 3/0052; H05K 2203/302; Y10T 29/53274
USPC ............................................................. 83/39
See application file for complete search history.

(56) References Cited

U.S. PATENT DOCUMENTS

| | | | | |
|---|---|---|---|---|
| 4,621,552 A * | 11/1986 | Lopez | ................................ | 83/27 |
| 4,683,789 A * | 8/1987 | Lopez | ................................ | 83/35 |
| 4,830,554 A * | 5/1989 | Lopez | ............................ | 409/164 |
| 4,945,796 A * | 8/1990 | Riley | ................................ | 83/49 |
| 5,913,956 A * | 6/1999 | Capps | ................................ | 83/39 |
| 6,047,470 A * | 4/2000 | Drussel et al. | .................. | 29/847 |
| 6,546,833 B1 * | 4/2003 | Gifford et al. | .................... | 83/34 |

* cited by examiner

*Primary Examiner* — Carl Arbes
(74) *Attorney, Agent, or Firm* — Muncy, Geissler, Olds & Lowe, P.C.

(57) ABSTRACT

A fixture applicable for breaking a circuit board includes: a bottom board, comprising a front side and a back side opposite to the front side; a breaking mechanism, disposed on the front side of the bottom board, and comprising a fixing board and a flap board adjacent to the fixing board, an axis line defined between the fixing board and the flap board, the flap board being flapped along the axis line, and the circuit board being placed on the fixing board and the flap board; a first platen, including a first moving device disposed on a side of the fixing board for fixing the circuit board onto the fixing board by the first moving device; and a second platen, including a second moving device disposed on a side of the flap board for fixing the circuit board onto the flap board by the second moving device.

11 Claims, 6 Drawing Sheets

FIXTURE FOR BREAKING CIRCUIT BOARD

CROSS-REFERENCE TO RELATED APPLICATION

This application claims the benefit of China Patent Application No. 201220386024.1, filed on Jul. 27, 2012, in the State Intellectual Property Office of the People's Republic of China, the disclosure of which is incorporated herein in its entirety by reference.

BACKGROUND OF THE INVENTION

1. Field of the Invention

The present invention relates to a fixture for breaking a board, and more particularly to a fixture applicable for breaking a circuit board.

2. Description of the Related Art

In recent years, the printed circuit board (PCB) industry blooms, and there are different methods for breaking printed circuit boards which are manufactured with integrated circuits.

The conventional circuit board breaking device has to be operated manually. In general, corresponding V-shape slots (or V-cuts) are formed on both front and back sides of the PCB respectively in advance. Thus, after printed circuits and electronic components are assembled and soldered onto the PCB, the PCB can be bent to break by hands. This method of breaking boards is simple and easy, but also has several drawbacks. When the circuit board is broken by hands, the forces applied by fingers are usually non-uniform so that the breaking line is usually uneven. A rough edge may be produced after the circuit board is broken, and the rough edge may result in injuries of the personnel in the production line and a poor quality of the product. In addition, it takes more effort to break the board manually when the circuit board has a small area or a narrow folding edge.

Moreover, to protect the printed circuits or solder joints on the circuit board and to overcome the aforementioned drawbacks, some manufacturers introduce expensive vacuum board breaking equipments that fix the circuit board by vacuum suction to prevent the circuit board from being bent or deformed. However, the vacuum board breaking equipment incurs a high cost and has a heavy weight which is unfavorable for repair and maintenance.

Therefore, it is necessary to provide a fixture for breaking a circuit board to overcome the aforementioned problems.

SUMMARY OF THE INVENTION

Therefore, it is a primary objective of the present invention to overcome the problems occurred in the process of breaking a circuit board by providing a novel fixture for breaking the circuit board. The problems to be solved include the uneven breaking line and the rough edge resulting from directly breaking the circuit board manually.

To achieve the aforementioned objective, the present invention provides a fixture for breaking a circuit board, comprising: a bottom board, comprising a front side and a back side opposite to the front side; a breaking mechanism, disposed on the front side of the bottom board, and comprising a fixing board and a flap board adjacent to the fixing board, an axis line being provided between the fixing board and the flap board, the flap board being flapped along the axis line, the circuit board being placed on the fixing board and the flap board; a first platen, including a first moving device disposed at a side of the fixing board for the first platen fixing the circuit board onto the fixing board through the first moving device; and a second platen, including a second moving device disposed at a side of the flap board for the flap board fixing the circuit board onto the flap board through the second moving device.

Therefore, the present invention is characterized in that the breaking mechanism, the first platen and the second platen are provided for fixing the circuit board into the fixture securely and completely to overcome the problem of deformation or damage of the circuit board caused by external forces, and to reduce the chance of directly touching the circuit boards by personnel, so as to improve the operation efficiency. Accordingly, damages of internal circuits in the boards or cracks of electronic components on the surface of the circuit board caused by the deformation of the circuit board can be efficiently prevented. The present invention also provides a design of limiting the breaking angle of the circuit board during the board breaking operation to prevent the edge of the circuit board from being bent excessively to produce too many board fibers and causing a defect of exposing copper foils.

The technical characteristics, contents, advantages and effects of the present invention will be apparent with the detailed description of a preferred embodiment accompanied with the illustration of related drawings as follows.

DESCRIPTION OF THE PREFERRED EMBODIMENTS

Figure 1:
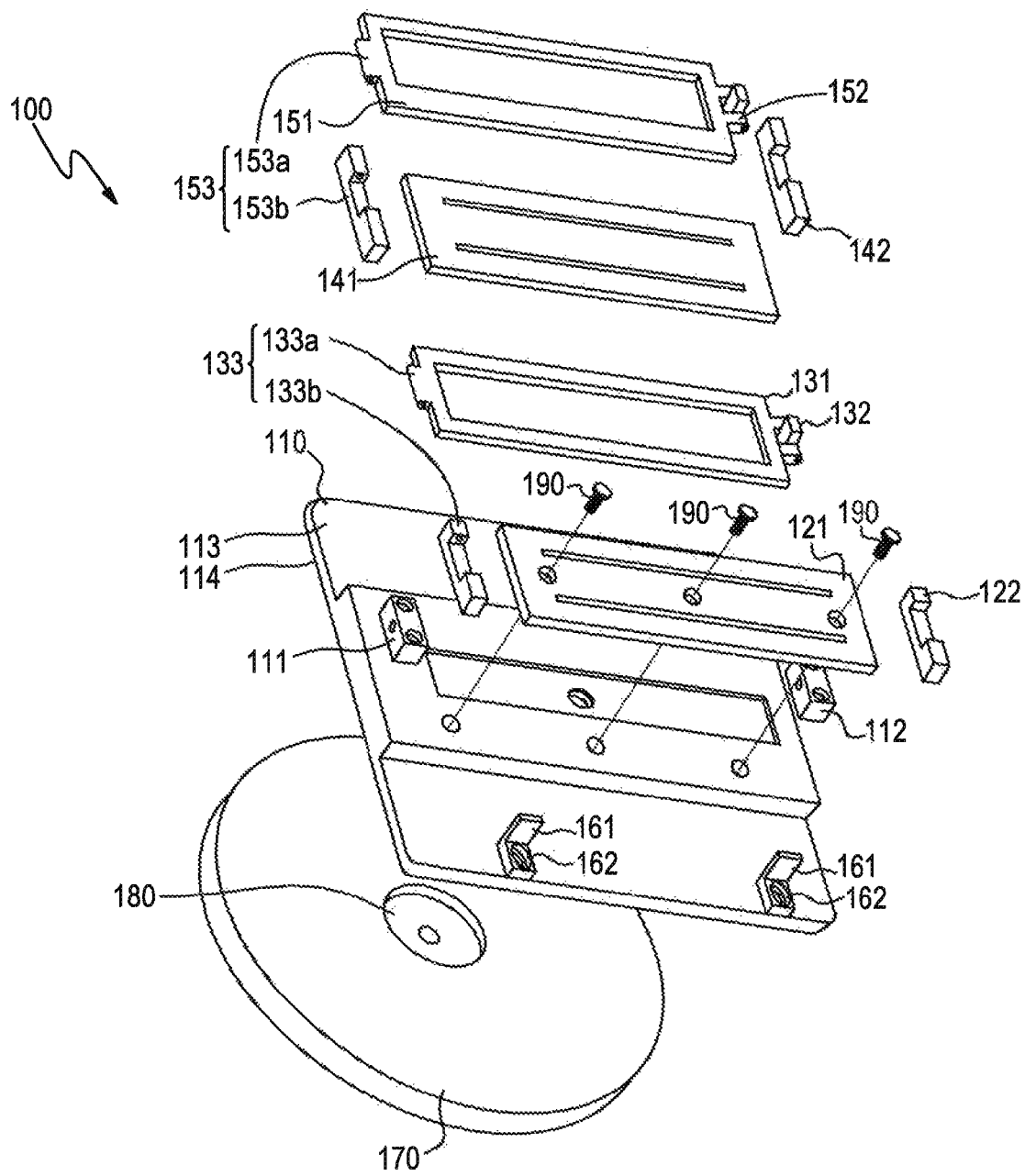
FIG. 1 is an exploded view of a fixture for breaking a circuit board of the present invention.
Figure 2:
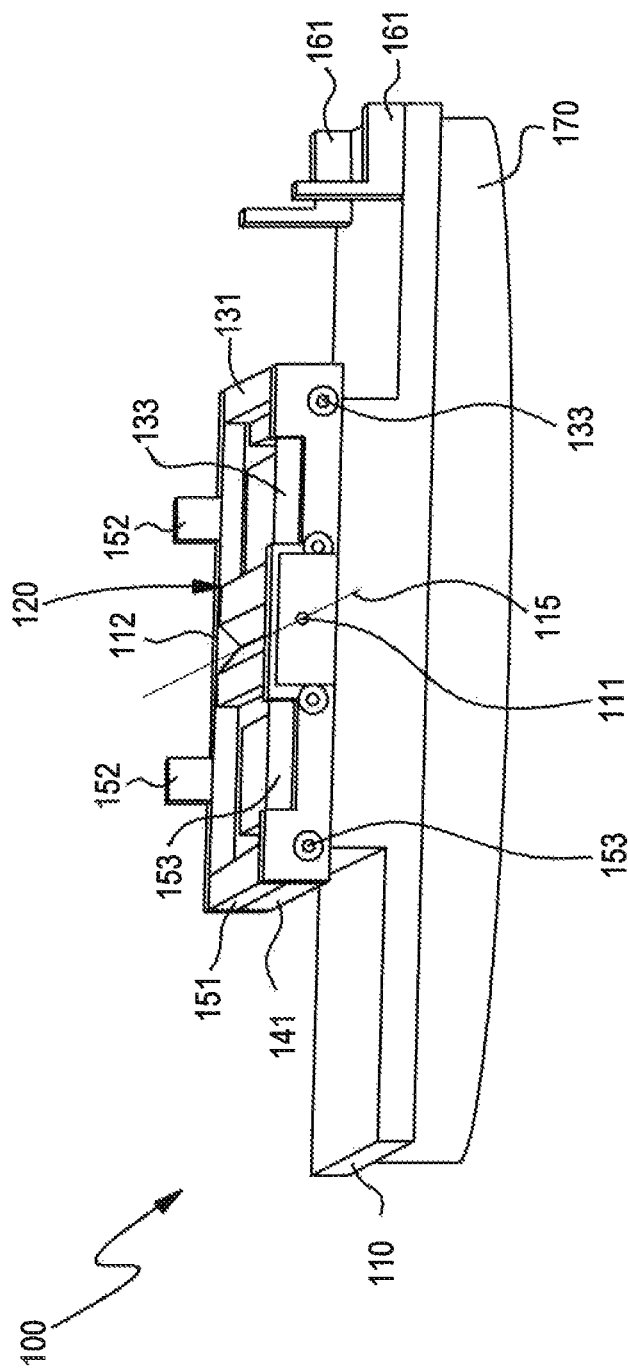
FIG. 2 is a side view of a fixture for breaking a circuit board of the present invention.
Figure 3:
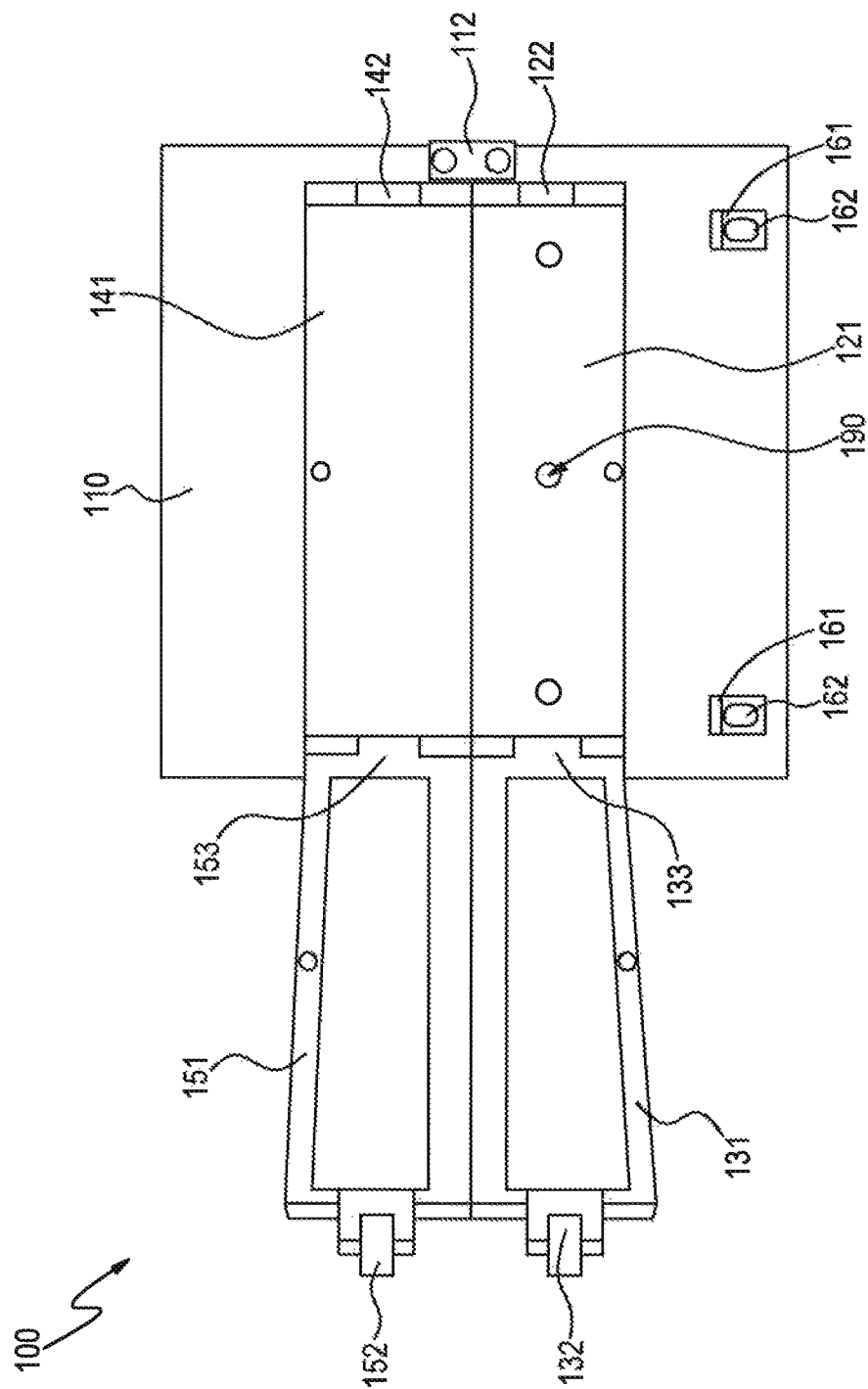
FIG. 3 is a top view of a fixture for breaking a circuit board of the present invention.

FIGS. 1 to 3 are an exploded view, a side view and a top view of a fixture for breaking a circuit board of one embodiment of the present invention, respectively. The fixture for breaking a circuit board 100 in accordance with the embodiment of the present invention is applicable for breaking a circuit board. The fixture 100 comprises a bottom board 110, a breaking mechanism 120, a first platen 131, a second platen 151, a positioning unit 161, a sliding rail 162, a first hook 132, a first hook base 122, a second hook 152, a second hook base 142, a bottom base 170, a shaft 180, a first rotary fixing board 111, a second rotary fixing board 112 and a fixing unit 190. The bottom board 110 comprises a front side 113 and a back side 114 opposing to the front side 113. The first platen 131 comprises a first moving device 133. The second platen 151 comprises a second moving device 153. In the embodiment of the invention, the positioning unit 161 may be a plunger and the fixing unit 190 may be a screw passing through the fixing boards 111, 112.

The breaking mechanism 120 is disposed at the front side 113 of the bottom board 110. The breaking mechanism 120 includes a fixing board 121 and a flap board 141 adjacent to the fixing board 121. The breaking mechanism 120 is secured to the bottom board 110 by passing and securing the fixing unit 190 through the fixing board 121 so that the breaking mechanism 120 can be fixed onto the bottom board 110.

An axis line 115 is defined between the fixing board 121 and the flap board 141. The first rotary fixing board 111 and the second rotary fixing board 112 are disposed on the bottom board 110 and positioned at both ends of the axis line 115, respectively. Holes are formed in the first rotary fixing board 111 and the second rotary fixing board 112, respectively. Bumps are formed at both ends of the flap board 141, respectively, and passed through the holes to secure the flap board 141 onto the bottom board 110 firmly. Since the hole and the bump are engaged with each other, the flap board 141 can be flapped along the axis line 115. In the present invention, the fixing board 121 and the flap board 141 are made of same material.

The first moving device 133 is installed on a side of the fixing board 121. In the embodiment of the present invention, the first moving device 133 is formed of a first fixed shaft 133a coupled to a short side of the first platen 131 and a first pivot base 133b disposed on the bottom board 110, and the first moving device 133 is installed on the short side of the fixing board 121. The first platen 131 fixes a circuit board (not shown) onto the fixing board 121 via the first moving device 133. In the embodiment of the present invention, the first platen 131 comes with a hollow design to prevent the components on the circuit board from being damaged when the first platen 131 fixes the circuit board.

Similarly, the second moving device 153 is installed on a side of the flap board 141. In an embodiment of the present invention, the second moving device 153 is formed of a second fixed shaft 153a coupled to a short side of the second platen 151 and a second pivot base 153b disposed on the bottom board 110, and the second moving device 153 is installed on the short side of the flap board 141. The second platen 151 fixes a circuit board (not shown) onto the flap board 141 via the second moving device 153. In the embodiment of the present invention, the second platen 151 is hollow for preventing components on the circuit board from being damaged when the second platen 151 fixes the circuit board.

The first hook base 122 is disposed on one side of the fixing board 121 and opposite to the first moving device 133. The first hook 132 is disposed on a side of the first platen 131 and on the same side of the first hook base 122. In the embodiment of the present invention, the first hook 132 is disposed on a short side of the first platen 131 and opposite to the first moving device 133. Similarly, the first hook base 122 is disposed on a short side of the fixing board 121 and on the same side of the first hook 132 such that the first hook 132 can be hooked to the first hook base 122.

Similarly, the second hook base 142 is disposed at a side of the flap board 141 and opposite to the second moving device 153. The second hook 152 is disposed at a side of the second platen 151 and on the same side of the second hook base 142. In the embodiment of the present invention, the second hook 152 is disposed at a short side of the second platen 151 and opposite to the second moving device 153. Similarly, the second hook base 142 is disposed at a short side of the flap board 141 and on the same side of the second hook 152 such that the second hook 152 can be hooked to the second hook base 142.

The positioning unit 161 can be disposed directly on the front side 113 of the bottom board 110 for limiting the position of the circuit board on the breaking mechanism 120.

In an embodiment of the present invention, the sliding rail 162 is disposed between the front side 113 of the bottom board 110 and the positioning unit 161 such that the positioning unit 161 can be moved along the sliding rail 162. The moving direction is perpendicular to the axis line 115, and thus the positioning unit 161 can be adjusted according to the size of the circuit board.

The bottom base 170 is disposed at the back side 114 of the bottom board 110, and the shaft 180 is disposed between the back side 114 of the bottom board 110 and the bottom base 170. The bottom board 110 can be rotated by the shaft 180.

Figure 4A:
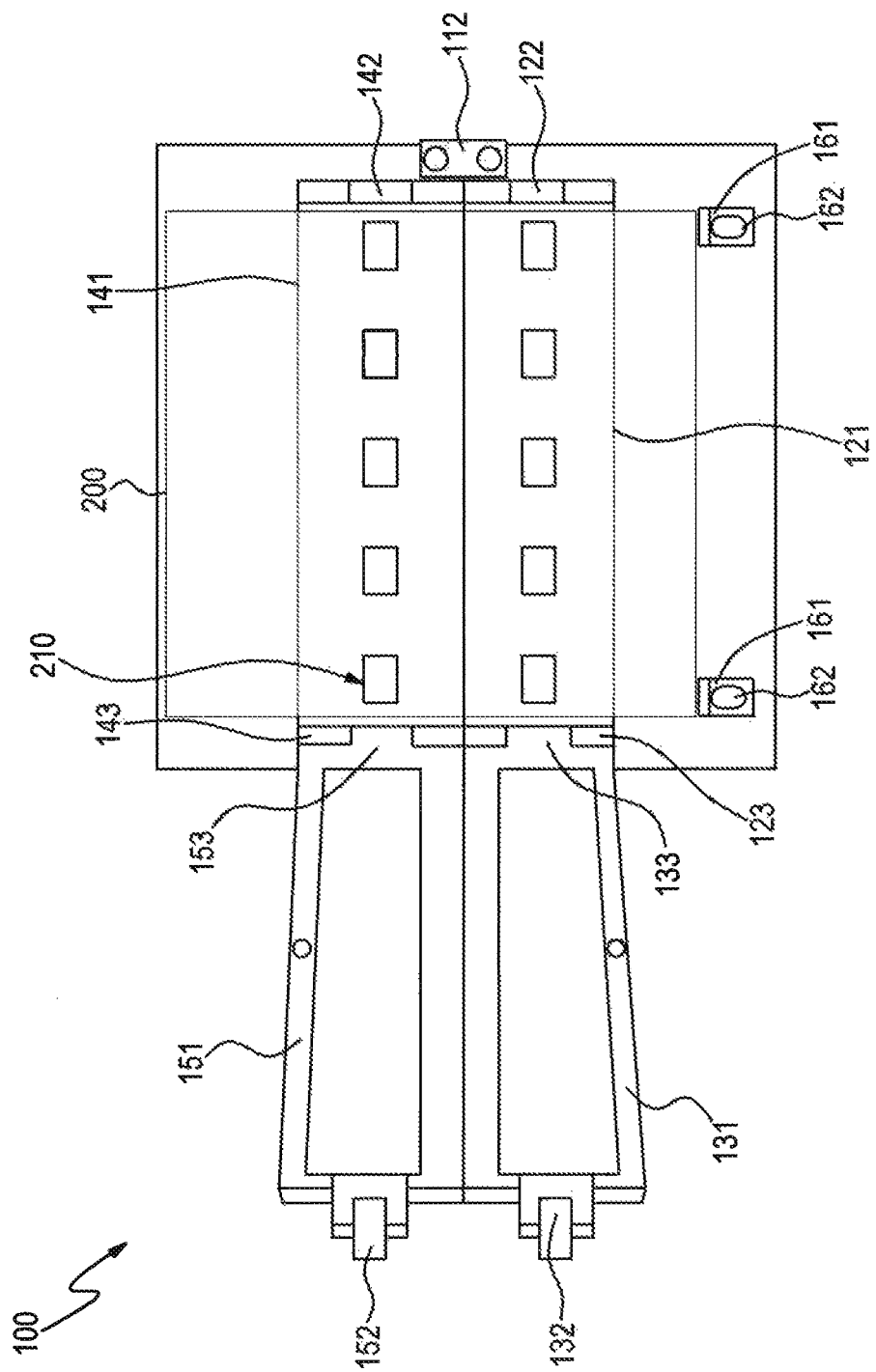
FIGS. 4A-4C are schematic views of using the fixture for breaking a circuit board in accordance with the present invention.
Figure 4B:
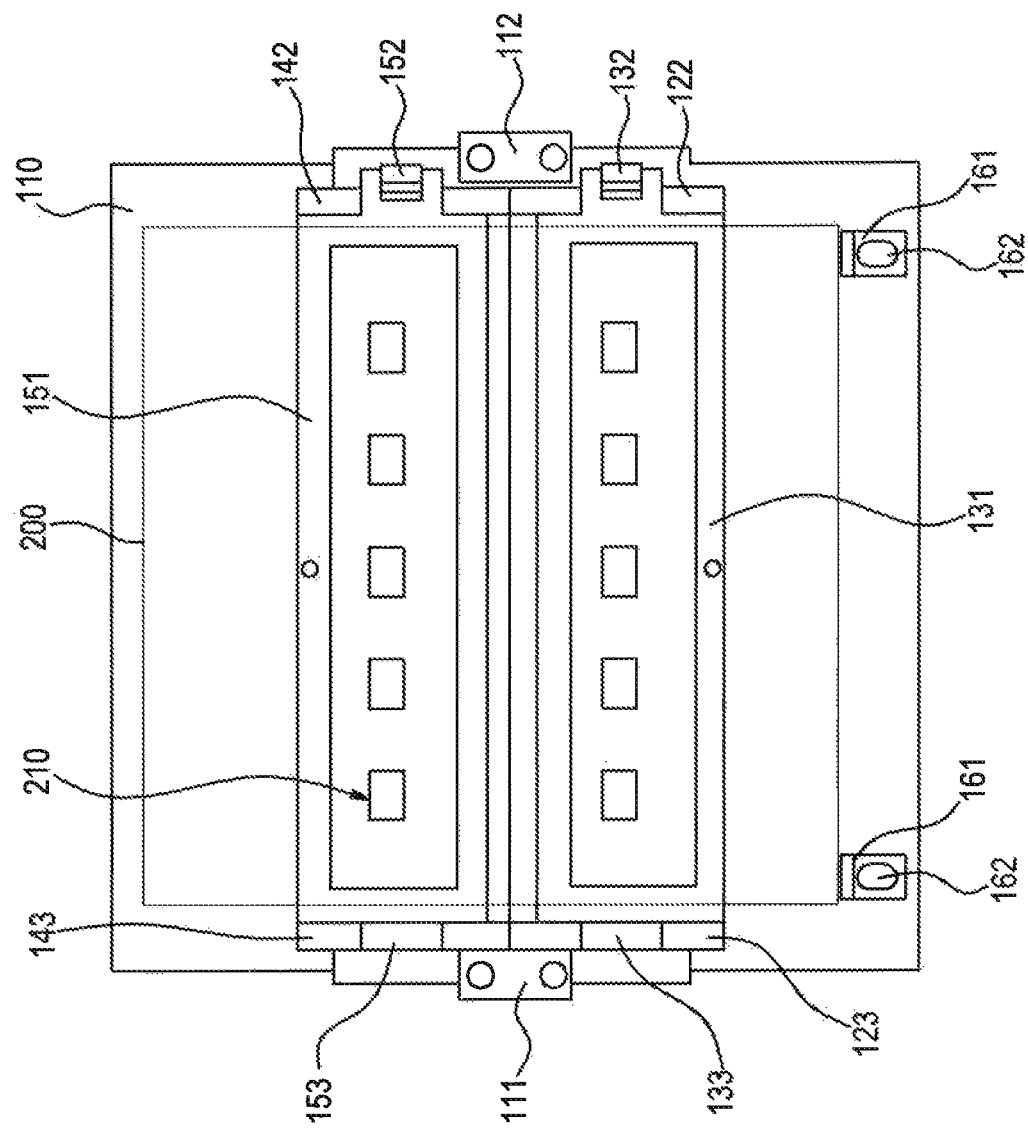
Figure 4C:
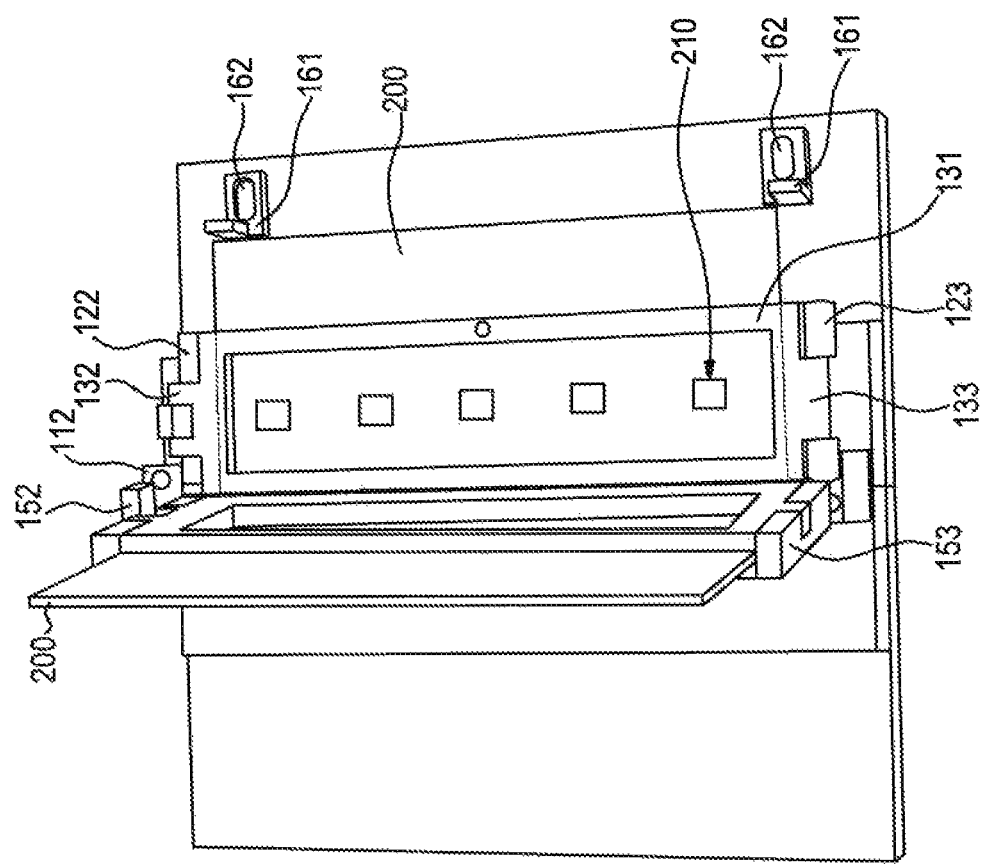

With reference to FIGS. 4A to 4C for schematic views of using the fixture for breaking a circuit board in accordance with the present invention, FIG. 4A shows that the first platen 131 and the second platen 151 are opened, and the circuit board 200 is placed on the fixing board 121 and the flap board 141. An edge of the circuit board 200 is aligned evenly with the positioning unit 161.

In FIG. 4B, the first platen 131 and the second platen 151 are rotated towards the fixing board 121 and the flap board 141, respectively. The first hook 132 hooks the first hook base 122 and the second hook 152 hooks the second hook base 142 so that the first platen 131 and the second platen 151 fix the circuit board 200. Both of the first platen 131 and the second platen 151 are hollow structures, and thus components 210 on the circuit board 200 will not be damaged during the process of fixing the circuit board 200.

In FIG. 4C, the flap board 141 is flapped along the axis line, and the circuit board 200 is divided into two pieces after the flap board 141 is flapped.

Therefore, the present invention is characterized in that the circuit board is fixed into the fixture securely and completely by the breaking mechanism, the first platen and the second platen so as to overcome the problem of deformation or damage of the circuit board caused by external forces and to reduce the chance of touching the circuit board directly by personnel so as to achieve the effects of improving the operation efficiency. Hence, damages of internal circuits in the circuit board or the crack of electronic components installed on the surface of the circuit board caused by the deformation of the circuit board can be prevented effectively. The present invention also provides a design of limiting the breaking angle of the circuit board during the board breaking operation to prevent the edge of the circuit board from being bent excessively to produce too many board fibers and causing a defect of exposing internal components and copper foils.

Since the present invention does not involve the operation of a cutting machine, the equipment wear and tear and operation time can be reduced. The present invention also has the following advantages. The first platen and the second platen come with a hollow design for preventing the components installed on the circuit board from being damaged during the process of fixing the circuit board. The design of the rotatable bottom board allows personnel to access and bend the circuit board more handily and conveniently. The design of the sliding rail and the positioning unit allows the fixture of the present invention to adapt different sizes of the circuit boards, and the positioning unit can be used for positioning a bent PCB for the secondary operation to minimize the damage of the circuit boards caused by poor operations.

While the invention has been described by means of specific embodiments, numerous modifications and variations could be made thereto by those skilled in the art without departing from the scope and spirit of the invention set forth in the claims.

What is claimed is:

1. A fixture for breaking a circuit board, comprising:
   a bottom board, comprising a front side and a back side opposite the front side;
   a breaking mechanism, disposed on the front side of the bottom board, and comprising a fixing board and a flap board adjacent to the fixing board, a fixing unit passing through the fixing board and securing the fixing board for fixing the breaking mechanism onto the bottom board, an axis line being provided between the fixing board and the flap board, a first rotary fixing board and a second rotary fixing board being positioned at both ends of the axis line and the flap board being engaged to the first rotary fixing board and the second rotary fixing board, the flap board being flapped along the axis line, the circuit board being placed on the fixing board and the flap board;

a first platen, comprising a first moving device disposed at a side of the fixing board, the first platen being pivotally coupled to the first moving device and fixing the circuit board on the fixing board through the rotation of the first platen; and a second platen, comprising a second moving device disposed on a side of the flap board, the second platen being pivotally coupled to the second moving device and fixing the circuit board on the flap board through the rotation of the second platen;

wherein, the circuit board placed on the fixing board and the flap board is divided into two pieces after the flap board is flapped.

2. The fixture of claim 1, further comprising a positioning unit disposed on the front side of the bottom board, an edge of the circuit board being aligned evenly with the positioning unit for limiting a position of the circuit board on the breaking mechanism.

3. The fixture of claim 2, wherein the positioning unit is a plunger.

4. The fixture of claim 2, further comprising a sliding rail disposed between the front side of the bottom board and the positioning unit, wherein the positioning unit moving along the sliding rail, in the vertical direction of the axis line.

5. The fixture of claim 1, further comprising a first hook and a first hooking base disposed at a side of the fixing board and opposed to the first moving device, the first hook being disposed at a side of the first platen and at the same side of the first hooking base, the circuit board being fixed by the first platen when the first hook being hooked to the first hook base.

6. The fixture of claim 1, further comprising a second hook and a second hooking base disposed at a side of the flap board and opposed to the second moving device, the second hook being disposed at a side of the second platen and at the same side of the second hooking base, the circuit board being fixed by the second platen fix when the second hook being hooked to the second hook base.

7. The fixture of claim 1, wherein the first platen is designed in hollow.

8. The fixture of claim 1, wherein the second platen is designed in hollow.

9. The fixture of claim 1, further comprising a bottom base and a shaft, wherein the bottom base is disposed at the back side of the bottom board, the shaft is disposed between the back side of the bottom board and the bottom base, and the bottom board rotates via the shaft.

10. The fixture of claim 1, wherein the fixing unit is a screw passing through the fixing board.

11. The fixture of claim 1, wherein the fixing board and the flap board are made of same material.

* * * * *

UNITED STATES PATENT AND TRADEMARK OFFICE
CERTIFICATE OF CORRECTION

PATENT NO. : 9,131,598 B2  
APPLICATION NO. : 13/842487  
DATED : September 8, 2015  
INVENTOR(S) : Xinshen Wu et al.

Page 1 of 1

It is certified that error appears in the above-identified patent and that said Letters Patent is hereby corrected as shown below:

ON THE TITLE PAGE

(71) Applicants, should be changed from "INVENTEC APPLIANCES (PUDONG) CORPORATION, Shanghai (CN); INVENTEC APPLIANCES CORP., New Taipei (TW); INVENTEC APPLIANCES (SHANGHAI) CO., LTD., Shanghai (CN)" to --INVENTEC APPLIANCES (PUDONG) CORPORATION, Shanghai (CN); INVENTEC APPLIANCES CORP., New Taipei City (TW); INVENTEC APPLIANCES (SHANGHAI) CO., LTD., Shanghai (CN)--.

(73) Assignees, should be changed from "INVENTEC APPLIANCES (PUDONG) CORPORATION, Shanghai (CN); INVENTEC APPLIANCES CORP., New Taipei (TW); INVENTEC APPLIANCES (SHANGHAI) CO., LTD., Shanghai (TW)" to --INVENTEC APPLIANCES (PUDONG) CORPORATION, Shanghai (CN); INVENTEC APPLIANCES CORP., New Taipei City (TW); INVENTEC APPLIANCES (SHANGHAI) CO., LTD., Shanghai (CN)--.

Signed and Sealed this  
Twenty-second Day of March, 2016

Michelle K. Lee  
*Director of the United States Patent and Trademark Office*